(12) United States Patent
Chen et al.

(10) Patent No.: US 11,778,858 B1
(45) Date of Patent: Oct. 3, 2023

(54) ELECTRONIC DEVICE DISPLAYS HAVING MICROLENSES

(71) Applicant: Apple Inc., Cupertino, CA (US)

(72) Inventors: Yuan Chen, Campbell, CA (US); Tae Woon Cha, Cupertino, CA (US); Jie Li, Santa Clara, CA (US); Junhwan Lim, Cupertino, CA (US); Xiaokai Li, Mountain View, CA (US); Zhibing Ge, Los Altos, CA (US); Guanjun Tan, Santa Clara, CA (US); Giovanni Carbone, Palo Alto, CA (US); Jose A. Dominguez-Caballero, San Jose, CA (US); Thanh Son Nguyen, Campbell, CA (US)

(73) Assignee: APPLE INC., Cupertino, CA (US)

( * ) Notice: Subject to any disclaimer, the term of this patent is extended or adjusted under 35 U.S.C. 154(b) by 99 days.

(21) Appl. No.: 17/517,463

(22) Filed: Nov. 2, 2021

Related U.S. Application Data

(60) Provisional application No. 63/133,711, filed on Jan. 4, 2021.

(51) Int. Cl.
*H10K 50/858* (2023.01)
*G02F 1/1335* (2006.01)
*H10K 59/38* (2023.01)
*H10K 59/35* (2023.01)

(52) U.S. Cl.
CPC ..... *H10K 50/858* (2023.02); *G02F 1/133514* (2013.01); *G02F 1/133526* (2013.01); *H10K 59/353* (2023.02); *H10K 59/38* (2023.02)

(58) Field of Classification Search
CPC ............ H10K 50/858; G02F 1/133526; G02B 3/0006; G02B 3/005; G02B 3/0062; F21V 5/004
See application file for complete search history.

(56) References Cited

U.S. PATENT DOCUMENTS

| | | | |
|---|---|---|---|
| 7,687,757 | B1 | 3/2010 | Tseng et al. |
| 8,254,030 | B2 | 8/2012 | Steenblik et al. |
| 8,262,271 | B2 | 9/2012 | Tillin et al. |
| 10,317,686 | B2 | 6/2019 | Iwane |
| 2003/0001986 | A1 | 1/2003 | Fukuda et al. |
| 2013/0279012 | A1 | 10/2013 | Lee et al. |
| 2016/0109752 | A1* | 4/2016 | Tateno ................ G02B 3/0068 349/110 |

\* cited by examiner

*Primary Examiner* — Angela K Davison
(74) *Attorney, Agent, or Firm* — TREYZ LAW GROUP, P.C.; Joseph F. Guihan

(57) ABSTRACT

An electronic device may have a display with an array of display pixels. To increase the efficiency of the display, the display may also include an array of microlenses. Each microlens may overlap and focus light from a respective pixel. Pixels for one of the colors of light may have a high aspect ratio. These pixels may be covered by two microlenses or a single cylindrical microlens. The microlens dimensions may be tuned to mitigate non-uniformities in the brightness profiles of the pixels. The microlens edges may be laterally shifted towards or away from the center of the light-emitting areas to either reduce or increase the focusing power of the microlens. The microlenses and color filter elements in each pixel may also be shifted to account for the chief ray angle of the display.

12 Claims, 14 Drawing Sheets

ELECTRONIC DEVICE DISPLAYS HAVING MICROLENSES

This application claims the benefit of provisional patent application No. 63/133,711, filed Jan. 4, 2021, which is hereby incorporated by reference herein in its entirety.

BACKGROUND

This relates generally to electronic devices, and, more particularly, to electronic devices with displays.

Electronic devices often include displays. For example, an electronic device may have a liquid crystal display (LCD) based on liquid crystal display pixels or an organic light-emitting diode (OLED) display based on organic light-emitting diode pixels. Displays sometimes may have lower than desired efficiency and/or non-uniformities between different colors at certain viewing angles.

It would therefore be desirable to be able to provide improved displays for electronic devices.

SUMMARY

An electronic device may have a display such as a liquid crystal display or an organic light-emitting diode display. The display may have an array of display pixels. The display pixels may include pixels that emit different colors of light such as red pixels, green pixels, and blue pixels.

To increase the efficiency of the display, the display may include an array of microlenses. Each microlens may overlap and focus light from a respective pixel. Pixels for one of the colors of light may have a high aspect ratio. These pixels may be covered by two microlenses or a single cylindrical microlens.

The microlens dimensions may be tuned to mitigate non-uniformities in the brightness profiles of the pixels. For example, the microlens edges may be laterally shifted towards or away from the center of the light-emitting areas to either reduce or increase the focusing power of the microlens. These focus-reducing and focus-increasing offsets may be used to tune the brightness profiles of each color of light and mitigate brightness non-uniformities across off-axis viewing angles.

The microlenses and color filter elements in each pixel may also be shifted to account for the chief ray angle of the display. As an example, the microlenses and color filter elements may be shifted away from the center of the pixel array as the distance from the center of the pixel array increases. In a given pixel, the microlens may be shifted by a greater magnitude than the color filter element.

DETAILED DESCRIPTION

Figure 1:
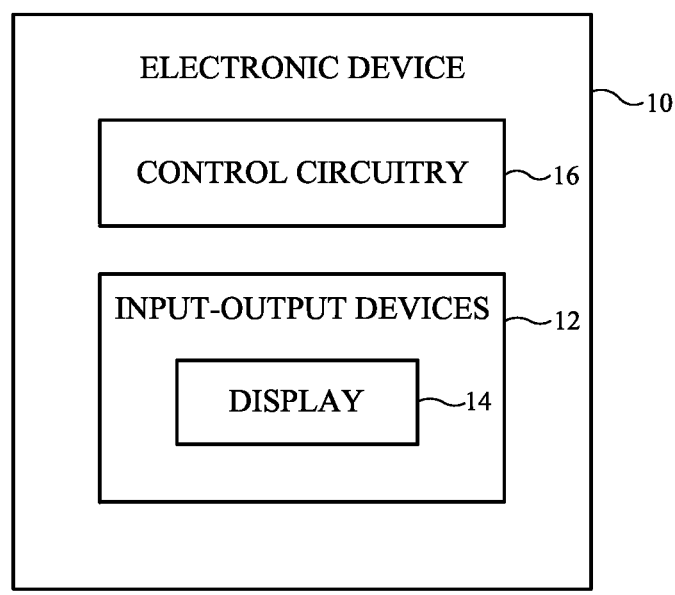
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user. As examples, electronic device 10 may be an augmented reality (AR) headset and/or virtual reality (VR) headset.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, keypads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
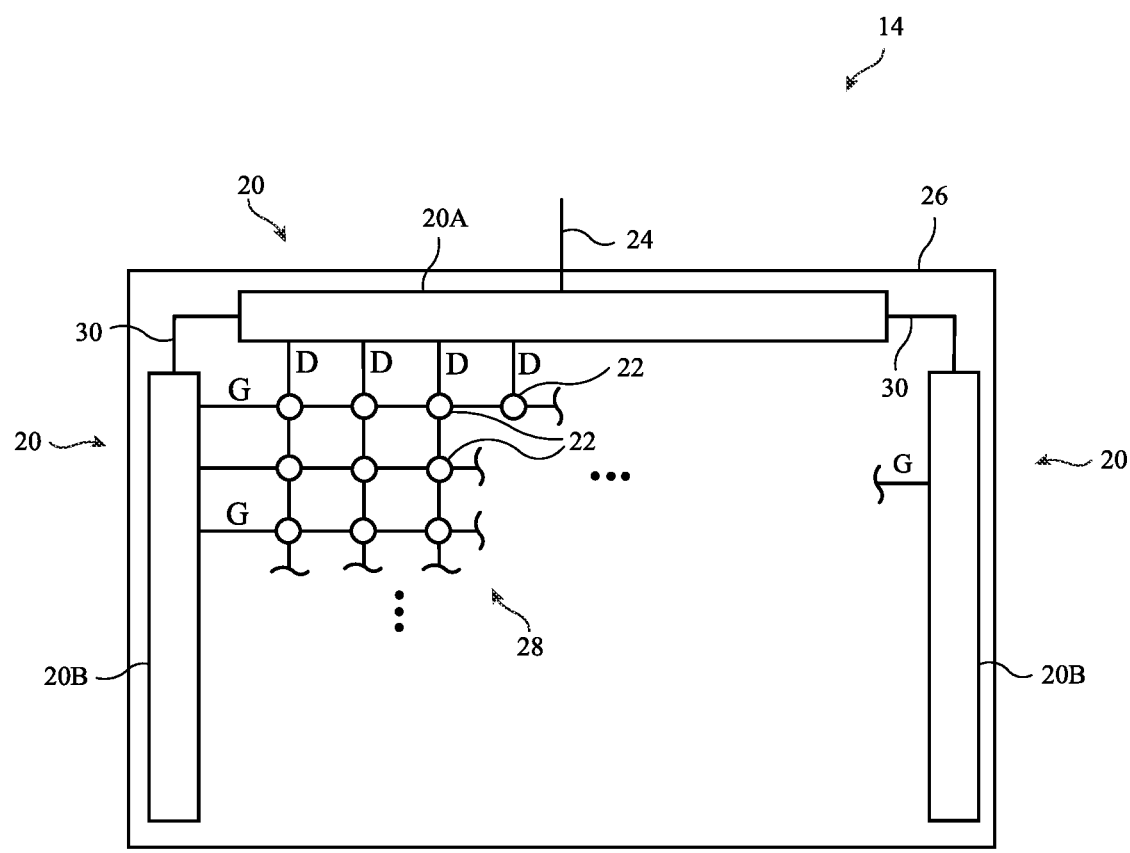
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Display 14 for device 10 may be a liquid crystal display, an organic light-emitting diode display, an electrophoretic display, a plasma display, an electrowetting display, a display formed using other display technologies, or a display that uses two or more of these display technologies in a hybrid configuration.

Figure 3:
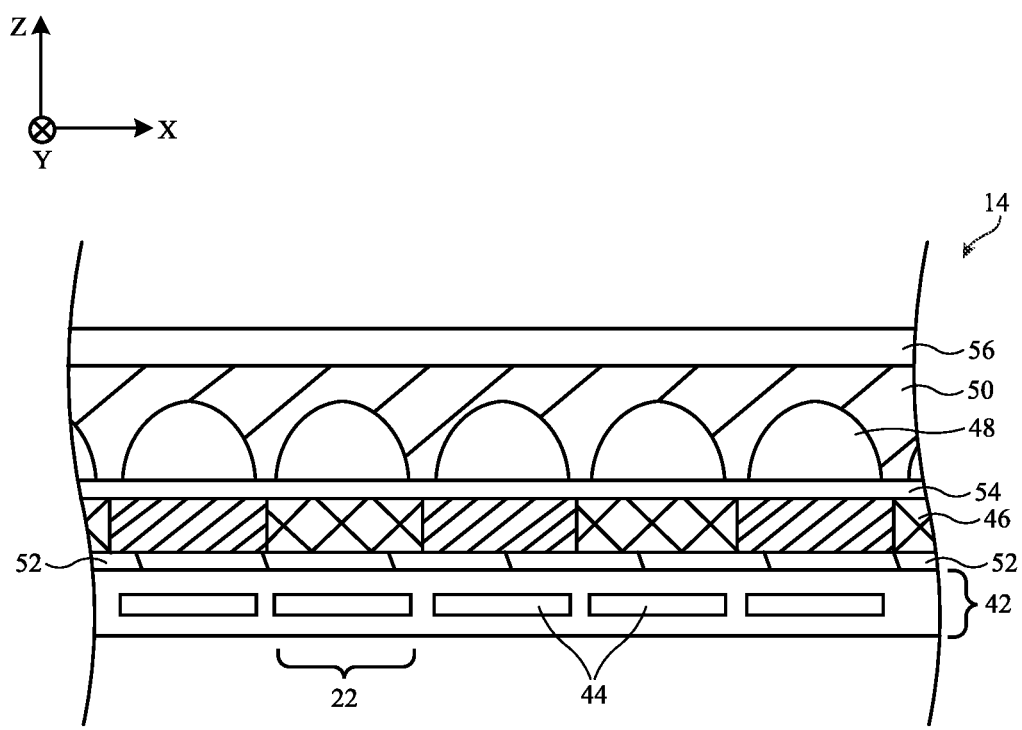
FIG. 3 is a cross-sectional side view of an illustrative display including microlenses over each pixel in accordance with an embodiment.

FIG. 3 is a cross-sectional side view of an illustrative display that includes microlenses to increase display efficiency. The microlenses may redirect off-axis light closer to the on-axis direction (e.g., perpendicular to the display), thereby increasing brightness at on-axis viewing angles. As shown in FIG. 3, display 14 may include a plurality of pixels 22. The display may include a display panel 42 that has a light-emitting area 44 for each pixel. The display panel may include thin-film transistor circuitry that controls the intensity of light emitted from each light-emitting area 44. The display panel 42 may include liquid crystal display pixels, organic light-emitting diode display pixels, or any other desired type of pixel.

Each light-emitting area 44 may be laterally surrounded (e.g., in the XY-plane) by an opaque masking layer or other opaque component. The light-emitting area may be formed by an aperture in the opaque masking layer and therefore may sometimes be referred to as a pixel aperture or pixel opening. In addition to a pixel aperture 44, each pixel 22 includes a respective color filter element 46 and microlens 48. The light-emitting area 44 may also sometimes itself be referred to as a pixel.

The color filter elements 46 may be collectively be referred to as a color filter layer. The color filter layer may include a plurality of color filter elements of different colors. For example, the color filter layer may include red color filter elements, green color filter elements, blue color filter elements, or color filter elements of any other desired colors.

A respective microlens 48 is formed over each color filter element 46. The microlenses 48 may collectively be referred to as microlens array or microlens layer. Each microlens 48 may have a footprint that approximately covers the footprint of an underlying color filter element 46 and pixel aperture 44.

The microlenses 48 may have lens power due to a refractive index difference between the microlenses and the surrounding material. For example, microlenses 48 may be formed from a first material having a first refractive index. A conforming layer 50 may be formed over the microlens array and may conform to the upper surface of each microlens. The conforming layer 50 may be formed from a second material having a second refractive index that is different than the first refractive index. In particular, the first refractive index may be greater than the second refractive index (e.g., microlenses 48 have a greater refractive index than surrounding layer 50). This allows light from display panel 42 to be focused in the on-axis direction (e.g., towards the Z-axis).

As one example, microlenses 48 may be formed from an organic photopolymer. This example is merely illustrative. In general, microlenses 48 may be formed from any desired material. The surrounding layer 50 may also be formed from any desired material (e.g., an organic polymer resin). The difference in refractive indices between microlenses 48 and layer 50 may be greater than 0.05, greater than 0.10, greater than 0.15, greater than 0.20, greater than 0.25, between 0.10 and 0.30, between 0.10 and 0.20, etc.

A planarization layer 52 may be formed between color filter elements 46 and display panel 42. An overcoat layer 54 may be formed between color filter elements 46 and microlenses 48. A transparent layer 56 may be formed over conforming layer 50. The planarization layer 52, overcoat layer 54, and transparent layer 56 may be formed from any desired materials. In one example, overcoat layer 54 may have a refractive index that is the same or similar (e.g., within 0.05, within 0.02, within 0.01, etc.) to the refractive index of microlenses 48. Overcoat layer 54 and microlenses 48 may optionally be formed from the same material.

The display depicted in FIG. 3 is merely illustrative. In general, additional layers (e.g., a polarizer such as a linear polarizer, a wave plate such as a quarter wave plate, a backlight unit, etc.) may be included in the display if desired. As one example, a linear polarizer or a circular polarizer may be formed over transparent layer 56.

Figure 4A:
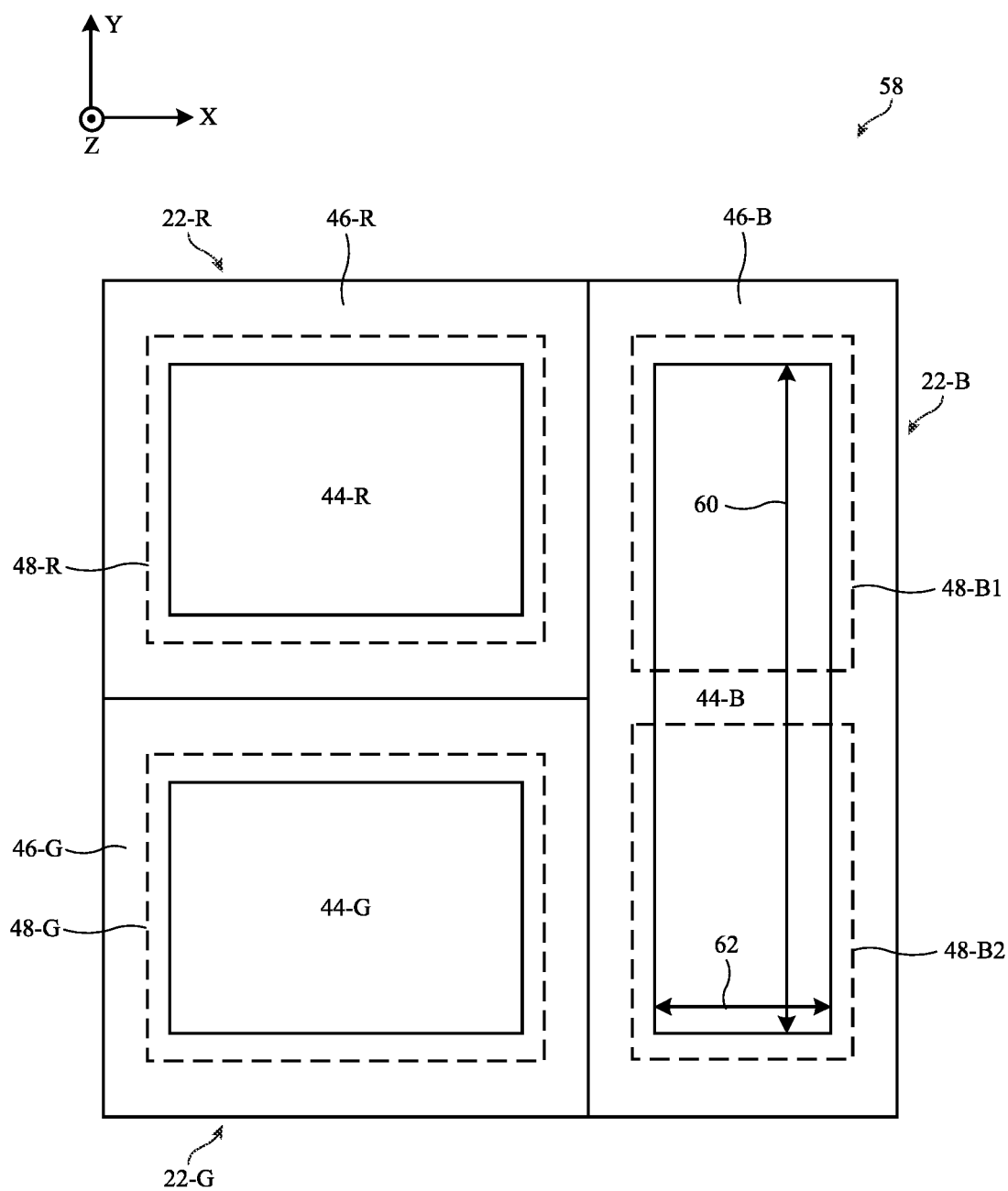
FIG. 4A is a top view of an illustrative unit pixel including a red pixel with a single microlens, a green pixel with a single microlens, and a blue pixel with two microlenses in accordance with an embodiment.

FIG. 4A is a top view of an illustrative unit pixel 58 that includes microlenses of the type shown in FIG. 3. All the microlenses in subsequent figures may be part of a stack-up similar to the stack-up shown and described in connection with FIG. 3. The unit pixel 58 of FIG. 4A includes a red pixel 22-R, a blue pixel 22-B, and a green pixel 22-G. The unit pixel may be repeated across the display.

It should be noted that the nomenclature of referring to a unit pixel that includes respective pixels of different colors is merely illustrative. In another possible nomenclature, the unit pixel may instead be referred to as a pixel that has respective sub-pixels of different colors. Herein, a light-emitting area of a given color will be referred to as a pixel and a group of pixels of different colors (as in FIG. 4A) will be referred to as a unit pixel or pixel group.

As shown in FIG. 4A, each pixel includes a respective light-emitting area 44 (e.g., pixel aperture). Pixel 22-R includes a pixel aperture 44-R through which red light is emitted. Pixel 22-B includes a pixel aperture 44-B through which blue light is emitted. Pixel 22-G includes a pixel aperture 44-G through which green light is emitted.

Each pixel aperture is covered (overlapped) by a respective color filter 46 and microlens 48. Pixel aperture 44-R is overlapped by red color filter 46-R and microlens 48-R. Pixel aperture 44-G is overlapped by green color filter 46-G and microlens 48-G. Pixel aperture 44-B is overlapped by blue color filter 46-B and microlenses 48-B1 and 48-B2.

The microlens for red pixel 22-R improves pixel 22-R's on-axis efficiency for red light. The microlens for green pixel 22-B improves pixel 22-G's on-axis efficiency for green light. The microlens for blue pixel 22-B improves pixel 22-B's on-axis efficiency for blue light.

As shown in FIG. 4A, first and second microlenses 48-B1 and 48-B2 may be included over the blue pixel aperture 44-B. The blue pixel aperture may have a relatively high aspect ratio. In other words, the ratio of height 60 (e.g., the longer dimension of the aperture) to width 62 (e.g., the shorter dimension of the aperture) for pixel aperture 44-B may be high. The aspect ratio of pixel aperture 44-B may be greater than 1.5, greater than 2, greater than 3, between 2 and 6, between 2 and 4, less than 5, etc. The aspect ratio of the blue pixel aperture may be greater than the aspect ratio of the green and red pixel apertures (e.g., by 10% or more, by 50% or more, by 100% or more, etc.).

Due to the high aspect ratio of aperture 44-B, forming a single microlens 48 over the aperture with desired curvature may have associated manufacturing difficulties. Therefore, two different microlenses may be used to cover the blue pixel aperture. Each one of microlenses 48-B1 and 48-B2 covers approximately (e.g., within 5% of) one half of the pixel aperture. Because microlenses 48-B1 and 48-B2 only need to cover half of the pixel aperture, the microlenses have a smaller aspect ratio than aperture 44-B and may be more easily manufactured with desired curvature.

Figure 4B:
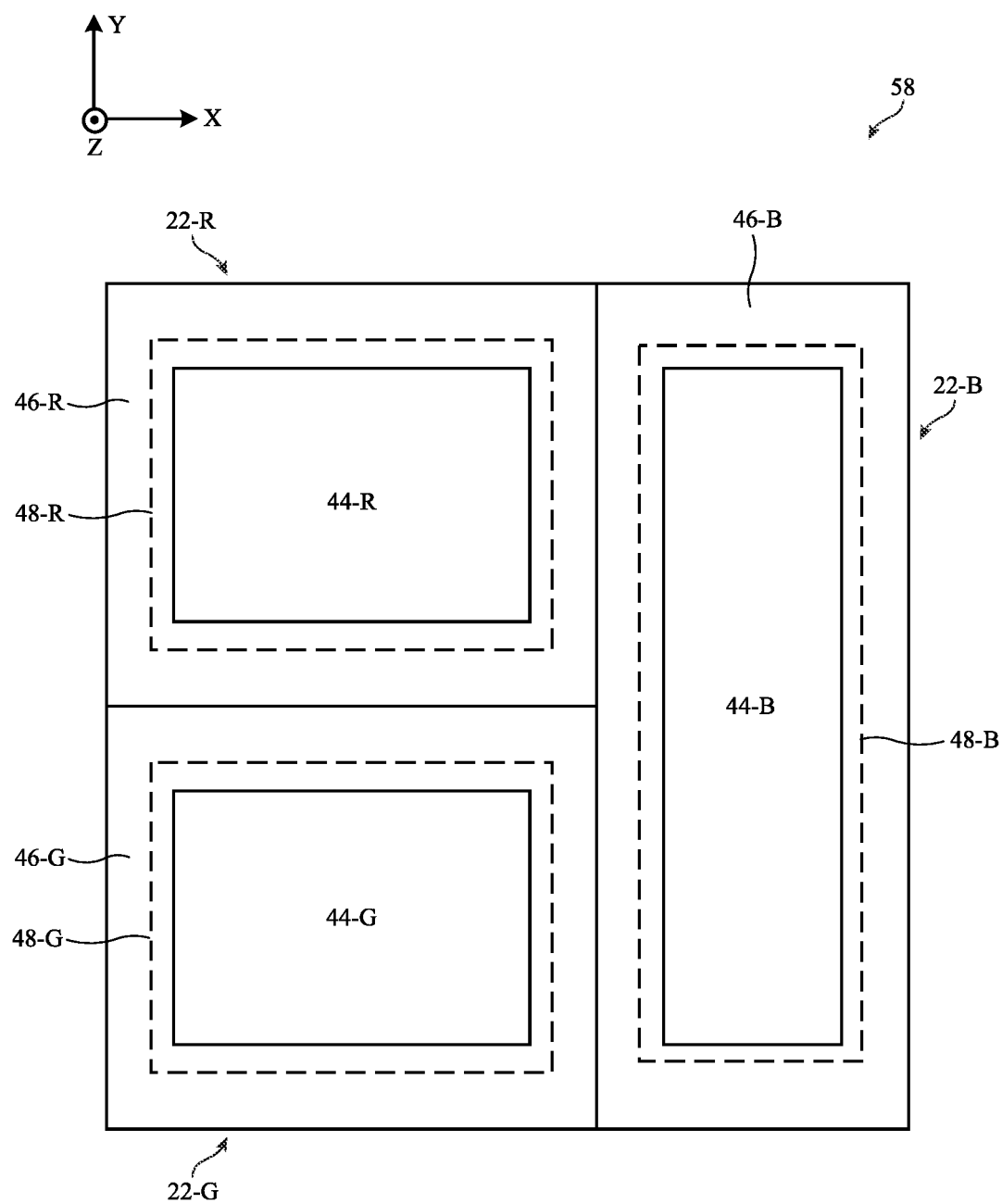
FIG. 4B is a top view of an illustrative unit pixel including a red pixel with a single microlens, a green pixel with a single microlens, and a blue pixel with a single cylindrical microlens in accordance with an embodiment.

FIG. 4B shows another option for forming the microlens over pixel aperture 44-B. As shown in FIG. 4B, a single microlens 48-B may be formed over pixel aperture 44-B. In FIGS. 4A and 4B, microlenses 48-R and 48-G may have curvature along two axes (e.g., the Y-axis and the X-axis). In FIG. 4A, each one of microlenses 48-B1 and 48-B2 may also have curvature along two axes. Having curvature along two axes provides the microlenses with focusing power in both the X-direction and the Y-direction.

In contrast, microlens 48-B in FIG. 4B may be a cylindrical microlens with curvature along only one axis. For example, the microlens may be curved along the X-axis such that the microlens focuses light in the X-direction. However, the microlens may not have curvature along the Y-axis. The cylindrical microlens may have a similar aspect ratio (e.g., within 5% of) as pixel aperture 44-B.

Figure 5:
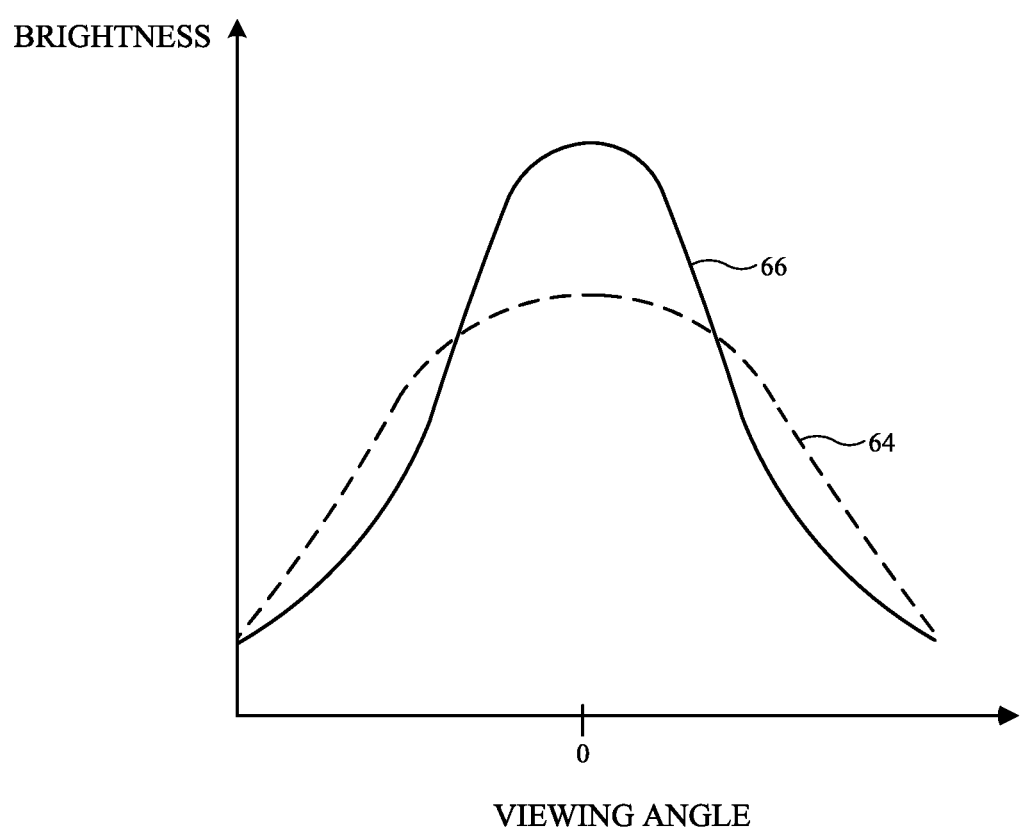
FIG. 5 is a graph of brightness versus viewing angle showing how microlenses such as the microlenses of FIGS. 3, 4A, and 4B may improve display efficiency in accordance with an embodiment.

FIG. 5 is a graph showing how including microlenses in the display as in FIGS. 3, 4A and 4B may improve display efficiency. FIG. 5 shows brightness as a function of viewing angle. A first profile 64 is shown for a pixel that does not include a respective microlens. A second profile 66 is shown for the same pixel, this time including a microlens. As shown in FIG. 5, adding a microlens to the pixel increases the brightness at on-axis viewing angles (e.g., angles at or near 0 degrees, where 0 degrees is parallel to the Z-axis in FIG. 3). The brightness at off-axis angles may be slightly lower when the microlens is used (due to the off-axis light being redirected in the on-axis direction). However, the on-axis efficiency improvement may be preferred in some display designs, since the display is most often viewed from the on-axis direction.

Figure 6:
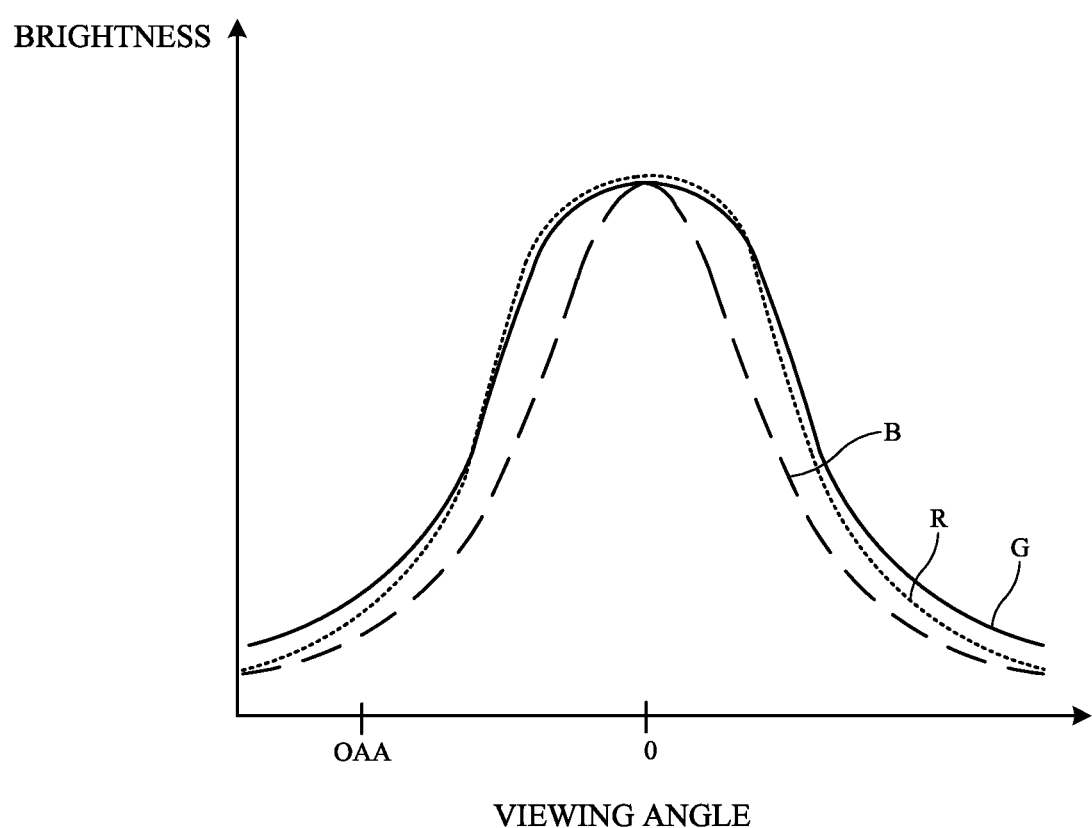
FIG. 6 is a graph of brightness versus viewing angle for pixels of different colors in a single display showing how off-axis non-uniformities may be present in accordance with an embodiment.

As discussed in connection with FIGS. 3-5, incorporating microlenses into the display may improve display efficiency. However, displays with (or without) microlenses may sometimes suffer from color shift and/or color non-uniformities. For example, consider the graph of FIG. 6. FIG. 6 shows brightness as a function of viewing angle for red, blue, and green pixels in a display that includes microlenses. The microlenses may have the arrangement shown in FIG. 4A, as an example. The profile labeled 'B' shows the brightness of the blue pixel in FIG. 4A, the profile labeled 'G' shows the brightness of the green pixel in FIG. 4A, and the profile labeled 'R' shows the brightness of the red pixel in FIG. 4A.

As shown in FIG. 6, the red, blue, and green pixels have a similar brightness levels on-axis (e.g., at 0 degrees). However, at off-axis angles (e.g., off-axis angle OAA in FIG. 6), the brightness of the pixels may vary. Green may be the brightest pixel at off-axis angles such as angle OAA in FIG. 6. The blue pixel may be dimmer than the green and red pixels at most off-axis angles including angle OAA. The varying profiles shown in FIG. 6 may cause visible artifacts at off-axis viewing angles. To mitigate these types of artifacts and have the brightness profiles be more uniform at off-axis viewing angles, the microlens dimensions may be tuned. This concept is shown in FIGS. 7 and 8.

It should be noted that the specific brightness profiles of FIG. 6 are merely illustrative. In general, the profiles of brightness versus viewing angle depend on the specific display technology/stack-up used (e.g., an organic light-emitting diode display having a first stack-up may have different emission profiles than an organic light-emitting diode display having a second stack-up, which may also have different emission profiles than a liquid crystal display, etc.). Regardless of the specific emission profiles for a particular display, the microlens dimensions may be tuned to mitigate non-uniformities in the emission profiles.

Figure 7A:
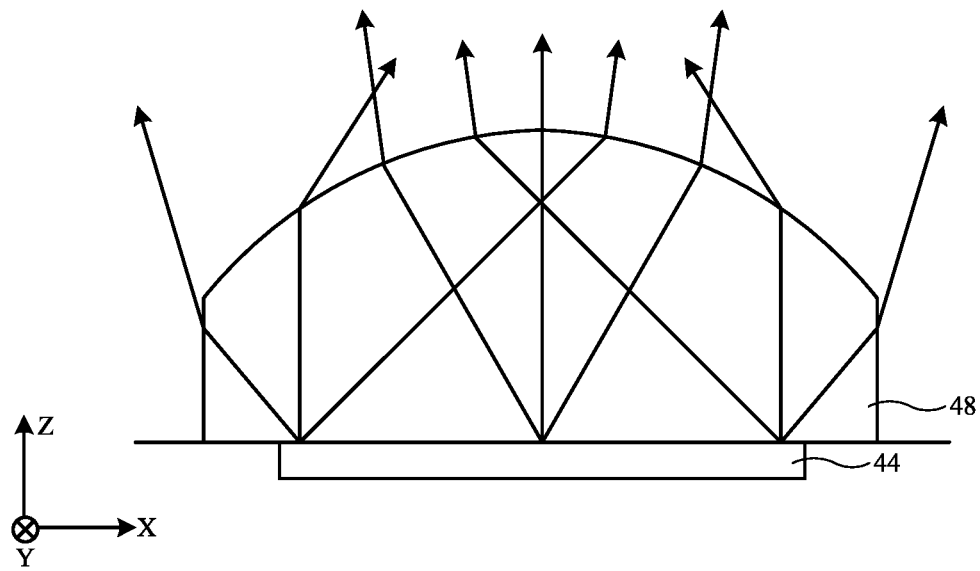
FIGS. 7A and 7B are cross-sectional side views of an illustrative microlens showing how dimension tuning may alter the focusing power of the microlens in accordance with an embodiment.

FIG. 7A shows an arrangement for microlens 48 where the microlens has a width that is greater than the width of light-emitting area 44. As shown, light emitted from both the center and edges of area 44 are focused by microlens 48. In contrast, in FIG. 7B the microlens has a width that is less than the width of the light-emitting area 44. Consequently, some of the light emitted from the edges of area 44 are not focused by microlens 48. This broadens the emission spectrum of the light-emitting area (e.g., the brightness will increase at off-axis viewing angles).

Herein, the lateral distance between the edge of the microlens and the edge of the underlying light-emitting area may be referred to as an offset or offset distance. Offsets of the microlens edge away from the light-emitting area (as in FIG. 7A) may be referred to as focus-increasing offsets (because the focusing power of the microlens is increased by the offset). Offsets of the microlens edge towards the interior of the light-emitting area (as in FIG. 7B) may be referred to as focus-reducing offsets (because the focusing power of the microlens is reduced by the offset).

Figure 7B:
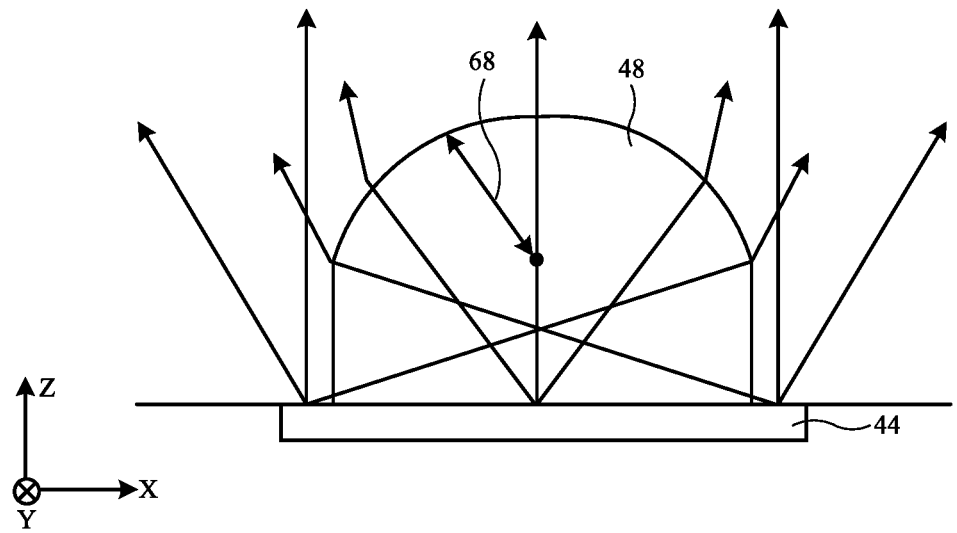
Figure 8:
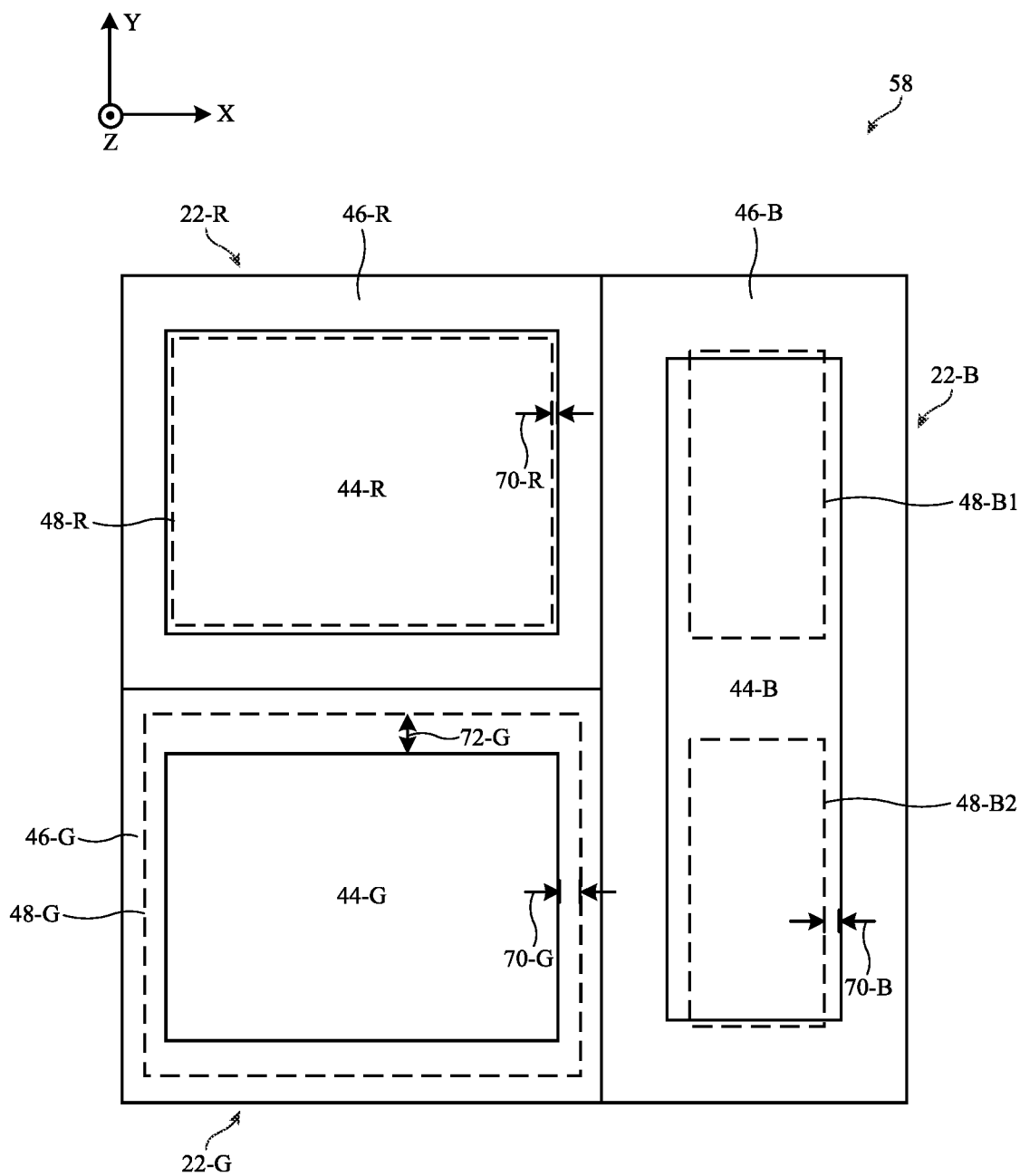
FIG. 8 is a top view of an illustrative unit pixel including microlenses having focus-increasing and focus-reducing offsets in accordance with an embodiment.

Instead of or in addition to changing the lateral dimensions of the microlens to tune the emission profile of the pixel, the radius of curvature of the microlens may be selected to optimize the emission profile of the pixel. A greater radius of curvature 68 (as shown in FIG. 7B) will provide microlens 48 with greater focusing power. Greater focusing power results in reduced brightness off-axis and increased brightness on-axis. Therefore, the radius of curvature of the upper surface of the microlens may be selected to optimize the emission profile of the underlying pixel.

FIG. 8 shows an example of how the microlens dimensions may be tuned to mitigate color shift in the display. As shown in FIG. 6, the blue emission is lower than the red and green emission at off-axis angles. To mitigate this difference, the dimensions of blue microlenses 48-B1 and 48-B2 are reduced. This reduces the focusing power of the microlens, which results in a shift of the emission spectrum to mitigate on-axis brightness while increasing off-axis brightness. Reducing the focusing power of the blue microlenses therefore mitigates the off-axis color differences of the display.

The dimensions of the microlenses along both the X-axis and Y-axis may be selected to control the emission profile for the pixels. As shown in FIG. 8, each microlens has an edge that is separated from the edge of its respective pixel aperture by a distance 70 along the X-axis (when viewed from above in the negative Z-direction). Increasing this distance in a direction away from the pixel aperture (e.g., resulting in more coverage of the pixel aperture) will increase the focusing power of the microlens (resulting in increased on-axis brightness and decreased off-axis brightness). Increasing this distance in a direction towards the center of the pixel aperture (e.g., resulting in less coverage of the pixel aperture) will decrease the focusing power of the microlens (resulting in decreased on-axis brightness and increased off-axis brightness).

Each pixel may have a respective offset distance 70. The red pixel 22-R has an offset distance 70-R, the green pixel 22-G has an offset distance 70-G, and the blue pixel 22-B has an offset distance 70-B. The offset distance and/or the offset direction for the microlens of each color may be different. For example, the red and blue pixels each have an offset towards the center of the pixel aperture (e.g., a focus-reducing offset) whereas the green pixel has an offset away from the center of the pixel aperture (e.g., a focus-increasing offset). Additionally, the magnitude of the offset distance may be different. The blue pixel may have the lowest off-axis brightness (as shown in FIG. 6). Therefore, the offset distance for the microlenses 48-B1 and 48-B2 is greater than the offset distance for microlens 48-R.

The offset between each microlens edge and pixel aperture edge may be any desired magnitude. For some pixels (e.g., pixels of a given color), the offset may be 0 (such that the edge of the microlens directly overlaps the edge of the pixel aperture).

Offset 70 in FIG. 8 may be referred to as horizontal offset (because it tunes the emission profile along the X-axis). The microlenses may also have vertical offsets 72 that tune the emission profiles along the Y-axis. As an example, green pixel 22-G has a vertical offset 72-G in FIG. 8. The vertical offsets may be selected independently of the horizontal offsets to optimize color uniformity across viewing angles in the vertical direction.

It should be noted that the examples of offsets in FIG. 8 that are used to tune the focusing power of the microlens are merely illustrative. As previously mentioned, the radius of curvature of each microlens may also be tuned to produce uniform color output from the display.

As one example, microlens 48-R, microlens 48-G, and microlenses 48-B1/48-B2 may have different radii of curvature along the X-axis. Microlenses 48-B1/48-B2 may have a radius of curvature that is lower than the radius of curvature of microlenses 48-G and 48-R. This lower radius of curvature reduces the focusing power of microlenses 48-B1/48-B2 and improves color uniformity at off-axis viewing angles.

Figure 9:
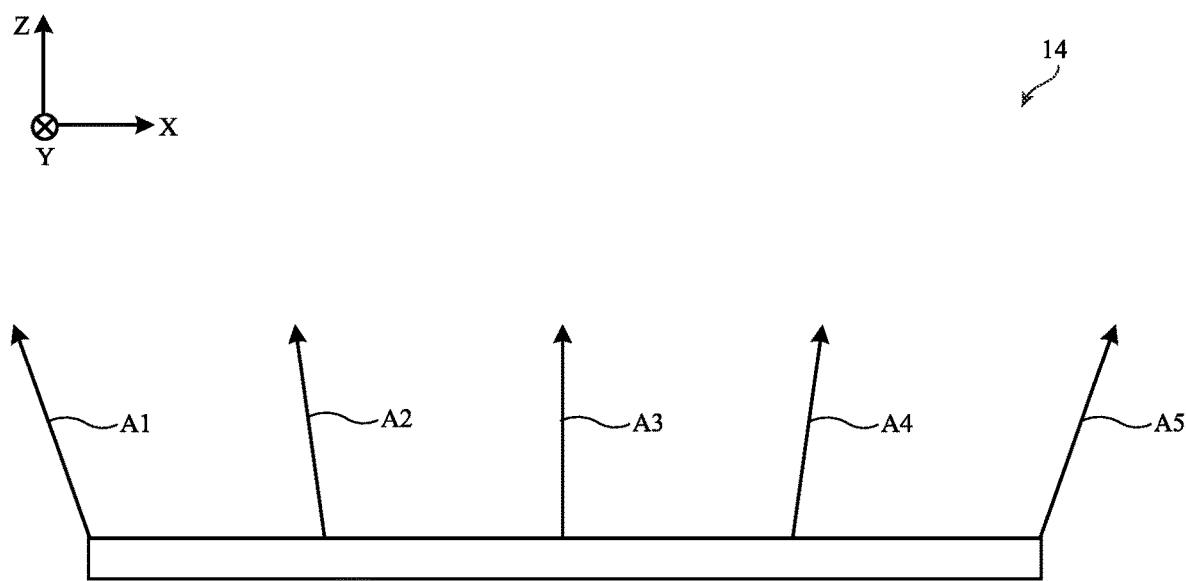
FIG. 9 is a cross-sectional side view of an illustrative display showing how the chief ray angle may vary across the display in accordance with an embodiment.

In some displays, the microlenses may also be designed to account for the chief ray angle of the display. FIG. 9 is a cross-sectional side view of an illustrative display 14. As shown, the chief ray angle (e.g., the central axis of a cone of light from that point of the display that ultimately reaches the viewer) may vary across the display. In the example of FIG. 9, the chief ray angle is parallel to the Z-axis (e.g., on-axis) in the center of the display, as shown by chief ray angle A3. However, the chief ray angle changes towards the edge of the display. As shown by chief ray angles A2 and A1, when moving away from the center of the display in the negative X-direction, the chief ray angle becomes more negative (e.g., becomes more angled in the negative X-direction). As shown by chief ray angles A4 and A5, when moving away from the center of the display in the positive X-direction, the chief ray angle becomes more positive (e.g., becomes more angled in the positive X-direction). As one example, the chief ray angle varying in this fashion may be the result of one or more lenses that are interposed between the display and the viewer during operation.

Figure 10:
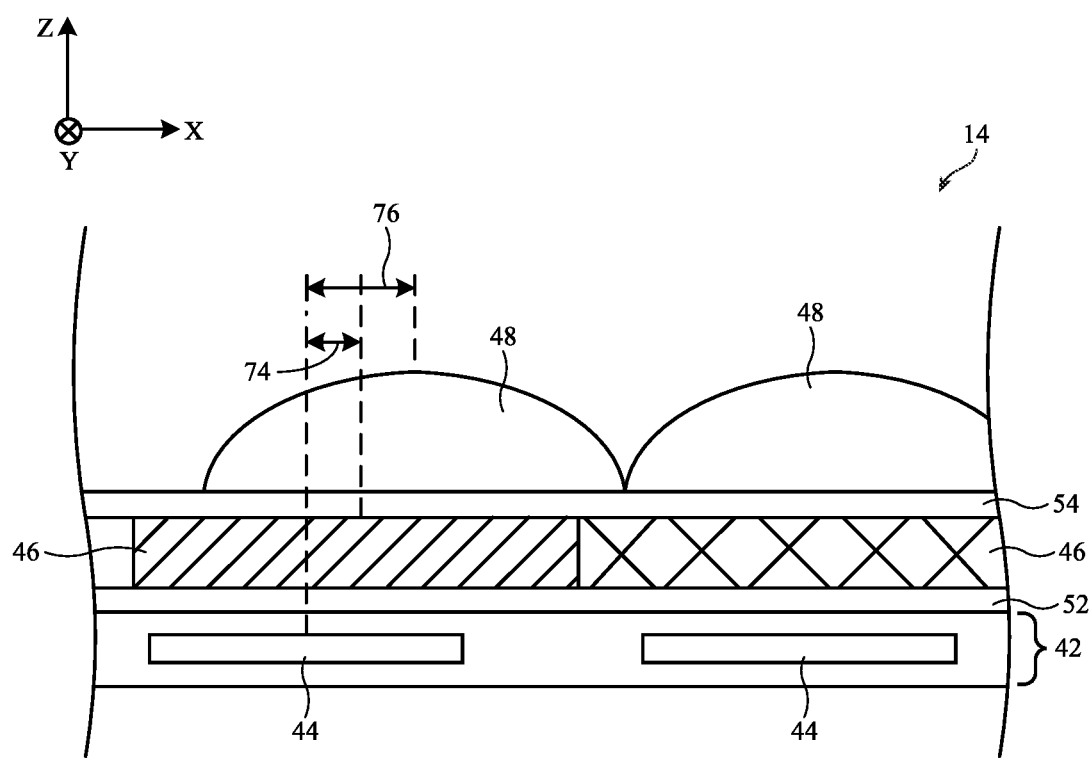
FIG. 10 is a cross-sectional side view of an illustrative display including microlenses and color filter elements that are shifted to account for chief ray angle in accordance with an embodiment.

As shown in FIG. 10, the microlens and color filter for each pixel may be shifted to account for the chief ray angle of the display in that region. The display in FIG. 10 has the same microlens and color filter arrangement as previously described in connection with FIG. 3. However, as shown in FIG. 10, the center of the color filter element 46 may be shifted from the center of its underlying pixel aperture 44 by a distance 74. Similarly, the center of microlens 48 may be shifted from the center of its underlying pixel aperture 44 by a distance 76. Distance 76 may be greater than distance 74 to account for the same chief ray angle (e.g., to account for the increased distance from the pixel aperture for microlens 48 compared to color filter element 46).

The shift distances 74 and 76 may increase with increasing distance from the center of the display. FIG. 10 shows the microlens and color filter element for a pixel being shifted along the X-direction. However, the microlens and color filter element for a pixel may instead or in addition be shifted along the Y-direction.

The color filter elements and the microlenses may be shifted away from the center of the display to account for the varying chief ray angle shown in FIG. 9. However, in some displays the chief ray angle may vary in a different manner than in FIG. 9. The microlenses and color filter elements may also optionally be shifted towards the center of the display to account for the chief ray angle if desired.

Figure 11:
FIG. 11 is a top view of an illustrative display showing how chief ray angle may vary across the display in accordance with an embodiment.

FIG. 11 is a top view of an illustrative display 14 having a varying chief ray angle across the display. The center of the display is marked by point P1. At point P1, the microlens and color filter elements may have centers that are the same as (e.g., directly overlap) the centers of the pixel apertures. Arrangements of this type are shown in, for example, FIGS. 4A, 4B, and 8. It should be noted that when two microlenses are used to overlap a single pixel aperture (as with the blue pixel aperture in FIGS. 4A and 8), the microlenses may still have the same middle point along the X-axis as the color filter and/or pixel aperture (even if the centers are not identical due to each microlens covering only one half of the pixel aperture).

Figure 12A:
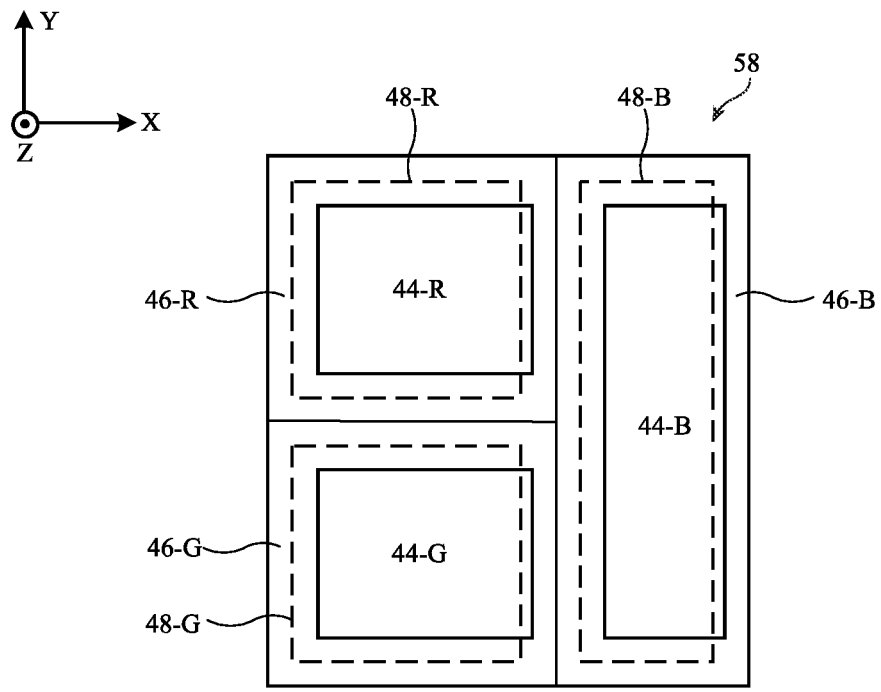
FIGS. 12A-12D are top views of illustrative unit pixels at different positions on the display of FIG. 11 showing how microlenses and color filter elements may be shifted to account for chief ray angle in accordance with an embodiment.
Figure 12B:
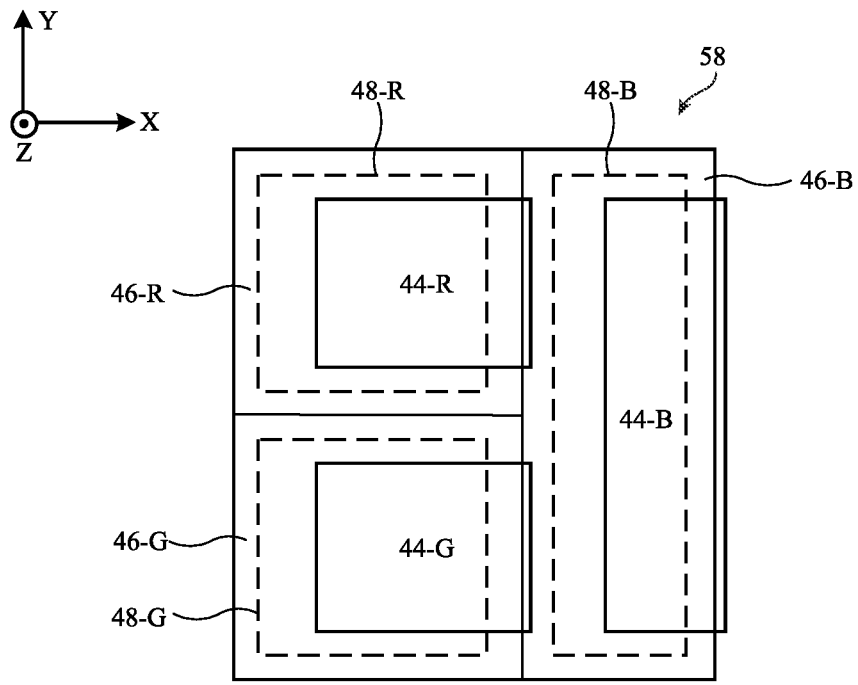

Point P2 is shifted in the negative X-direction relative to the center of the display. FIG. 12A is a top view if a pixel unit 58 at point P2 on the display. As shown, the microlenses and color filter elements are shifted in the negative X-direction. Point P3 is shifted even further than P2 in the negative X-direction. FIG. 12B is a top view if a pixel unit 58 at point P3 on the display. As shown, the microlenses and color filter elements are shifted in the negative X-direction by an amount that is greater than the amount in FIG. 12A.

As an example, the centers of pixel aperture 44-R and color filter element 46-R in FIG. 12A may be separated by a first distance. The centers of pixel aperture 44-R and color filter element 46-R in FIG. 12B may be separated by a second distance that is greater than the first distance. The centers of pixel aperture 44-R and microlens 48-R in FIG. 12A may be separated by a third distance (that is greater than the first distance). The centers of pixel aperture 44-R and microlens 48-R in FIG. 12B may be separated by a fourth distance that is greater than the third distance. This type of pattern may also apply to the other pixels in unit pixel 58.

Figure 12C:
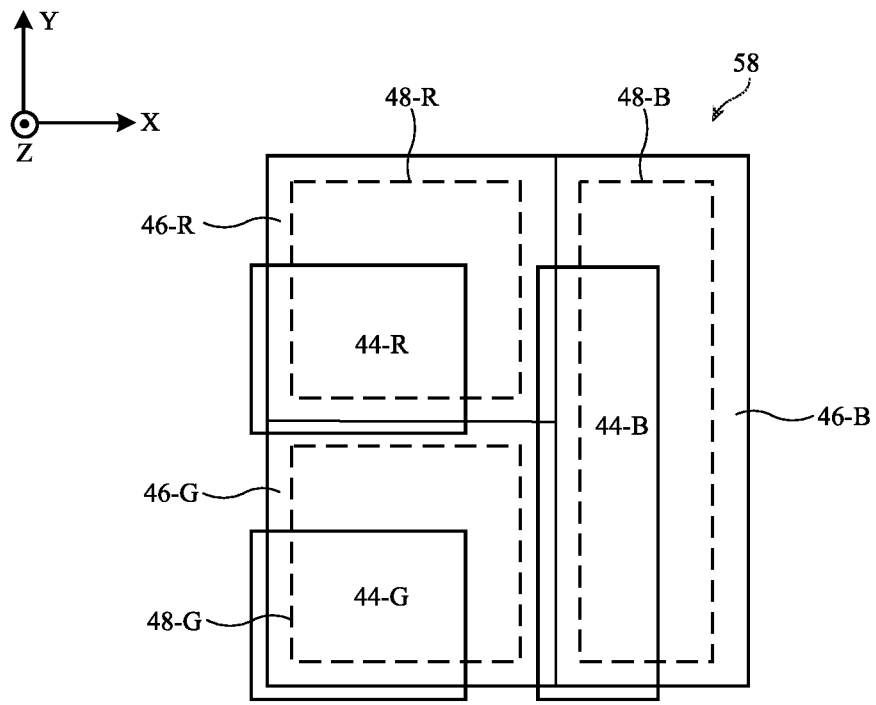
Figure 12D:
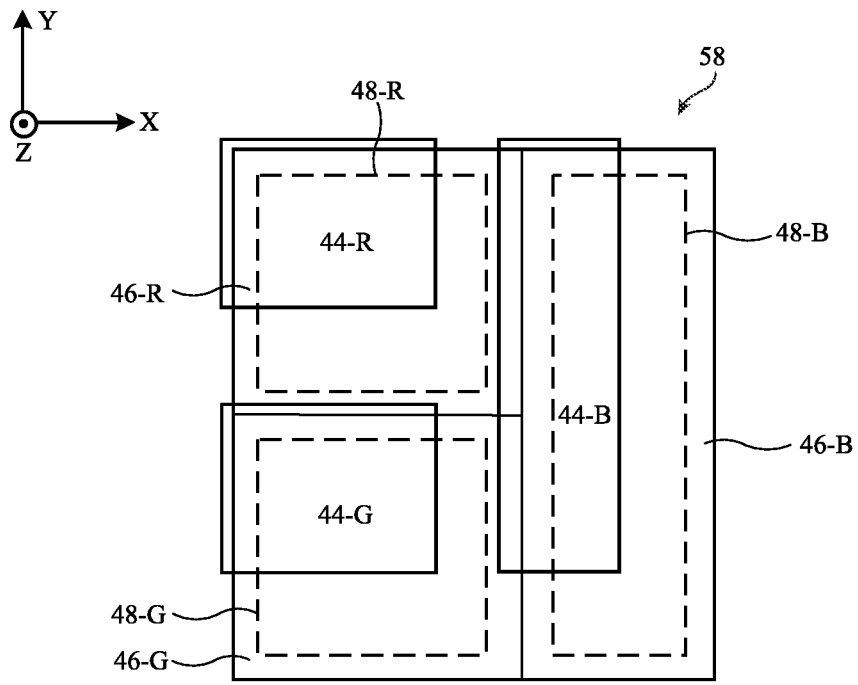

FIGS. 12A and 12B show how color filters and/or microlenses may be shifted along the X-axis. However, the color filters and/or microlenses may also be shifted along the Y-axis. FIG. 12C is a top view of a pixel unit 58 at point P4 on the display (e.g., in the upper-right corner). FIG. 12D is a top view if a pixel unit 58 at point P5 on the display (e.g., in the lower-right corner). Point P4 is shifted in both the positive X-direction and the positive Y-direction relative to the center of the display. Therefore, the microlenses and color filter elements in FIG. 12C are shifted in both the positive X-direction and the positive Y-direction. Point P5 is shifted in both the positive X-direction and the negative Y-direction relative to the center of the display. Therefore, the microlenses and color filter elements in FIG. 12D are shifted in both the positive X-direction and the negative Y-direction.

The color filter elements and/or microlenses may therefore be shifted to account for the chief ray angle at any given point in the display. The microlenses and color filter elements may be shifted by increasing amounts as the chief ray angle increases. In each pixel, the microlens may be shifted by a greater amount than the color filter element to account for the stack height difference between the microlenses and the color filter elements.

The color filter element shifts may be achieved by intermittently including a color filter element having a larger dimension. For example, every tenth color filter element may have a slightly greater width than the intervening nine color filter elements. Nine adjacent color filter elements in a row may have a width of a first magnitude. The tenth adjacent color filter element may have a width of a second magnitude that is slightly greater than the first magnitude (e.g., less than 1% greater, less than 10% greater, less than 5% greater, less than 20% greater, less than 0.5% greater, between 0.1% and 10% greater, etc. This pattern may repeat across the array.

As the color filter elements progress towards the edge of the array, the added shift from every tenth color filter element being slightly larger accumulates into progressively larger total shifts. This type of scheme may be used to increase the shift in both the X-direction (by increasing the color filter dimension in the X-direction) and Y-direction (by increasing the color filter dimension in the Y-direction). A similar scheme may also be used to produce the microlens shifts across the array.

The layouts for the unit pixel depicted herein are merely illustrative. In general, the disclosed concepts of including microlenses to improve display efficiency, including two microlenses or a cylindrical microlens over high aspect ratio pixels, tuning microlens dimensions to mitigate non-uniformity, and shifting color filter elements and/or microlenses to account for chief ray angle may all be applied to unit pixels having any desired layout.

The foregoing is merely illustrative and various modifications can be made by those skilled in the art without departing from the scope and spirit of the described embodiments. The foregoing embodiments may be implemented individually or in any combination.

What is claimed is:

1. A display comprising:
an array of pixels, wherein the array of pixels includes a first plurality of pixel apertures for a first color of light and a second plurality of pixel apertures for a second color of light that is different than the first color; and
an array of microlenses formed over the array of pixels, wherein:
first microlenses of the array of microlenses overlap the first plurality of pixel apertures and second microlenses of the array of microlenses overlap the second plurality of pixel apertures;
each one of the first microlenses has first and second opposing edges that are shifted towards a center of the pixel aperture it overlaps; and
each one of the second microlenses has third and fourth opposing edges that are shifted away from a center of the pixel aperture it overlaps.

2. The display defined in claim 1, wherein the first color of light is blue and the second color of light is green.

3. The display defined in claim 1, wherein each one of the first plurality of pixel apertures is overlapped by the first microlenses but not the second microlenses and wherein each one of the second plurality of pixel apertures is overlapped by the second microlenses but not the first microlenses.

4. The display defined in claim 1, wherein an offset between the first edge and a fifth edge of the pixel aperture for each one of the first microlenses is a focus-reducing offset.

5. The display defined in claim 4, wherein the focus-reducing offsets mitigate non-uniformity in brightness between the first and second colors of light.

6. The display defined in claim 4, wherein an offset between the third edge and a sixth edge of the pixel aperture for each one of the second microlenses is a focus-increasing offset.

7. The display defined in claim 6, wherein the focus-reducing offsets increase off-axis brightness for the first color of light and wherein the focus-increasing offset of the second microlenses increases on-axis brightness for the second color of light.

8. A display comprising:
an array of pixels, wherein the array of pixels includes a first plurality of pixel apertures for a first color of light, a second plurality of pixel apertures for a second color of light that is different than the first color, and a third plurality of pixel apertures for a third color of light; and
an array of microlenses formed over the array of pixels, wherein:
first microlenses of the array of microlenses overlap the first plurality of pixel apertures, second microlenses of the array of microlenses overlap the second plurality of pixel apertures, and third microlenses of the array of microlenses overlap the third plurality of pixel apertures;
each one of the first microlenses has a first edge that is shifted towards a center of the pixel aperture it overlaps relative to a second edge of that pixel aperture;
each one of the second microlenses has a third edge that is shifted away from a center of the pixel aperture it overlaps relative to a fourth edge of that pixel aperture; and
each one of the third microlenses has a fifth edge that is shifted towards a center of the pixel aperture it overlaps relative to a sixth edge of that pixel aperture, wherein the first edge of each one of the first microlenses is shifted by a first distance and wherein the fifth edge of each one of the third microlenses is shifted by a second distance that is less than the first distance.

9. The display defined in claim 8, wherein the first color is blue, the second color is green, and the third color is red.

10. The display defined in claim 9, wherein each one of the first plurality of pixel apertures is overlapped by a single cylindrical microlens from the first microlenses, wherein each one of the second plurality of pixel apertures is overlapped by a single respective microlens from the second microlenses, and wherein each one of the third plurality of pixel apertures is overlapped by a single respective microlens from the third microlenses.

11. The display defined in claim 9, wherein each one of the first plurality of pixel apertures is overlapped by first and second respective microlenses from the first microlenses, wherein each one of the second plurality of pixel apertures is overlapped by only a single respective microlens from the second microlenses, and wherein each one of the third plurality of pixel apertures is overlapped by only a single respective microlens from the third microlenses.

12. The display defined in claim 11, wherein each one of the first plurality of pixel apertures has an aspect ratio greater than 3.

* * * * *